(12) United States Patent
Maier

(10) Patent No.: US 8,167,454 B2
(45) Date of Patent: May 1, 2012

(54) PROTECTIVE SHEATH FOR A LED BAND

(75) Inventor: Christine Maier, Asselfingen (DE)

(73) Assignee: Osram AG, Munich (DE)

( * ) Notice: Subject to any disclaimer, the term of this patent is extended or adjusted under 35 U.S.C. 154(b) by 303 days.

(21) Appl. No.: 12/473,031

(22) Filed: May 27, 2009

(65) Prior Publication Data

US 2009/0296382 A1  Dec. 3, 2009

(30) Foreign Application Priority Data

May 28, 2008  (DE) .................. 10 2008 025 398

(51) Int. Cl.
F21V 33/00  (2006.01)

(52) U.S. Cl. .............................. 362/249.02; 362/311.02

(58) Field of Classification Search ............ 362/249.02, 362/249.04, 311.02
See application file for complete search history.

(56) References Cited

U.S. PATENT DOCUMENTS

| 5,193,895 | A | * | 3/1993 | Naruke et al. ................. 362/542 |
| 6,027,227 | A | * | 2/2000 | Tung ............................. 362/241 |
| 6,673,292 | B1 | | 1/2004 | Gustafson et al. |
| 2002/0093832 | A1 | * | 7/2002 | Hamilton ....................... 362/555 |
| 2002/0191386 | A1 | | 12/2002 | Cleaver et al. |
| 2005/0259424 | A1 | | 11/2005 | Zampini, II et al. |
| 2006/0202850 | A1 | * | 9/2006 | Hefright et al. .......... 340/815.45 |
| 2007/0076427 | A1 | * | 4/2007 | Reo et al. ....................... 362/555 |
| 2007/0291473 | A1 | * | 12/2007 | Traynor ....................... 362/106 |

FOREIGN PATENT DOCUMENTS

| DE | 4101418 A1 | 9/1991 |
| DE | 69632848 T2 | 11/2004 |
| DE | 202005002425.2 U1 | 5/2005 |
| DE | 202006017983 U1 | 3/2007 |

OTHER PUBLICATIONS

English Abstract for DE 202006017893 U1.
English Abstract for DE 202005002425U1.

* cited by examiner

Primary Examiner — Laura Tso

(57) ABSTRACT

The protective sheath has a basis for attaching the LED band and an at least partially light-transmissive covering attachable thereto, wherein the basis and the covering form an accommodation space for the LED band in the attached state.

22 Claims, 3 Drawing Sheets

PROTECTIVE SHEATH FOR A LED BAND

CROSS-REFERENCE TO RELATED APPLICATIONS

This application claims priority to German Patent Application No. 10 2008 025 398.7, filed May 28, 2008. The complete disclosure of the above-identified application is hereby fully incorporated herein by reference.

TECHNICAL FIELD

The invention relates to a protective sheath for a LED band, a lighting apparatus comprising such a protective sheath and a LED band as well as a method for producing a lighting apparatus comprising a LED band and a protective sheath for the LED band.

BACKGROUND

Flexible bands provided with light emitting diodes (flexible LED bands) are known which are separable and are provided with a self-adhesive back. For example, the flexible LINEARlight series from the company OSRAM is known, from which a LED band wound up on a reel is available (for example the series LM1X), wherein depending on the design the overall module comprises from 120 to 600 LEDs. The basic size of the overall module (length×width×height) is 6400 mm×10 mm×3 mm. The basic size of the smallest unit comprising 10 LEDs (length×width) is 140 mm×10 mm. By accurate cutting the overall module may be separated into units comprising 10 LEDs or multiples thereof without losses in function. The minimum bending radius of the LED band is 2 cm. The LED band has a self-adhesive back. In order to avoid shortages during mounting onto a metallic basis isolation between the basis and the LED band has to be provided instead of solder contacts.

As a protection against humidity or dust it is known to varnish the LED band. Furthermore, as a protective sheath for LED bands of the flexible LED series silicone tubes (company Neo Neon) or a silicone sealing (company Vossloh Schwabe) are known. With these protective sheathes limitations exist with regard to a feasible overall length (which particularly is strongly limited when using a sealing solution) and with regard to the ability of modular separation and the corresponding necessary sealing at the cutting location.

SUMMARY

According to various embodiments, a feasibility for protecting LED bands, in particular flexible LINEARlight products from OSRAM, and in particular for protecting these against mechanical stress, dust and humidity while maintaining the ability of modular separation of the LED band and without significant limitations regarding a feasible overall length can be provided. Furthermore, feasibility for protecting LED bands can be provided while maintaining a production of endless bands (reel to reel production).

According to an embodiment, a protective sheath for an LED band may comprise a basis for attaching the LED band and an at least partially light-transmissive covering attachable thereto, wherein the basis and the covering in the attached state form an accommodation space for the LED band.

According to a further embodiment, the basis can be flexible. According to a further embodiment, the basis may comprise a well heat conducting material, particularly aluminum or an aluminum composite material. According to a further embodiment, the basis can be band-shaped and can be attached to the covering along a lateral area. According to a further embodiment, the width of the basis can be equal to or greater than the width of the LED band. According to a further embodiment, a terminal area of the protective sheath can be finalized by means of an end cap. According to a further embodiment, the covering may provide a bulge for each of the light emitting diodes of the LED band. According to a further embodiment, the covering may be light-transmissive in an area close to a LED and is non light-transmissive otherwise. According to a further embodiment, the covering can be light-transmissive at the bulge and is non light-transmissive otherwise. According to a further embodiment, the covering may comprise a plastic sheet. According to a further embodiment, the covering may comprise at least one optical element for guiding the beam of the light emitted by the LED band.

According to another embodiment, a lighting apparatus, MAY comprise such a protective sheath and at least one LED band accommodated therein.

According to a further embodiment, the LED band may bear on the basis in a laminar manner, particularly may be glued thereto. According to a further embodiment, the lighting apparatus may be separable or separable by cutting.

According to yet another embodiment, a method for manufacturing a lighting apparatus comprising a LED band and comprising a protective sheath for the LED band comprising a basis for attaching the LED band and an at least partially light-transmissive covering attachable thereto, wherein during attaching the basis to the covering an accommodation space is formed for the LED band, may comprises at least the following steps:—applying the LED band to the basis;—affixing the basis to the covering.

BRIEF DESCRIPTION OF THE DRAWINGS

In the following figures the invention is described in more detail on the basis of exemplary embodiments. In doing so, for a better clarity equal or equally acting elements may be provided with equal reference numbers.

DETAILED DESCRIPTION

Figure 1A:
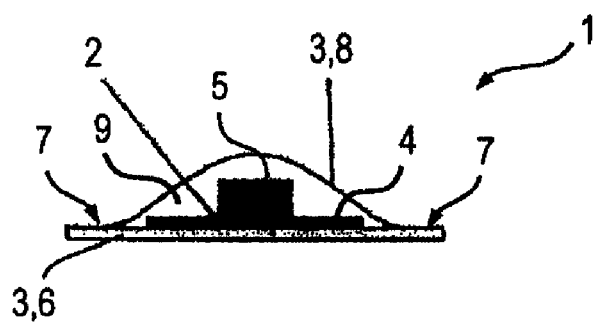
FIG. 1 shows a lighting apparatus comprising a LED band with a protective sheath according to a first embodiment in a cross-sectional view (FIG. 1A) and in a top view (FIG. 1B)

The protective sheath for a LED band has a basis for attaching the LED band and an at least partially light-transmissive covering connectable to the basis, wherein in a state connected to each other the basis and the covering form an accommodation cavity for the LED band. Thereby a protection of the LED band accommodated therein is afforded. Since the characteristics of the support and the covering are adjustable across a wide range, in particular the modular separation of the LED band may be maintained, for example in that the protective sheath may be cut through together with the LED band. Also, the protective sheath may be formed comparatively lightweight and ductile, so that limitations with respect to a feasible overall length may be avoided. Furthermore, the simple construction allows for a production of an endless band (reel to reel production).

In particular, the LED band may comprise a band-shaped substrate comprising at least one light emitting diode attached to an upper side of the substrate. The LED band may further comprise electric and/or electronic components for operating the light emitting diode(s), for example resistors and driver components.

The basis may be produced from a plastic and/or a metal for example, the covering, for example, from a plastic, e.g. from a so called "Low Density Polyethylene" (LD-PE), an amorphous PET, PP and so on.

In order to maintain the flexibility of a LED band, which in particular comprises a flexible substrate, an arrangement is preferred where the basis and the covering are flexible.

In an arrangement, a sufficient stability and rigidity, respectively, of the protective sheath may be reached substantially by means of the covering. For example, this may be adjusted by means of a sufficiently high thickness, rigidity and/or a shaping (for example using reinforcing elements) of a plastic material used, whose rigidity consequently is higher than that of the basis. Alternatively, the rigidity/flexibility of the protective sheath may be significantly affected by the basis, or by the basis and the covering together.

In order to dissipate heat from the LED band it is particularly preferred, if the basis comprises a well heat conducting ($\lambda \geq 15$ W/(m*K)) material, for example a metal or a well heat conducting plastic, particularly preferred aluminum or an aluminum composite material.

In order to achieve a good flexibility and simultaneously a good heat dissipating characteristic and a simple production method it is preferred that the basis comprises an aluminum foil or a foil of aluminum composite material, particularly in the form of a foil with a low thickness of 0.010 to 0.015 mm. Conditional upon its thinness the foil is very ductile and adds only little to the rigidity of the protective sheath.

For a simple manufacturing process and handling the basis preferably is band-shaped and connected to the covering along a lateral area.

The covering may generally be connected to the basis by means of all known and suited types of interconnections, for example by means of rolling, pinching, perforating, particularly micro-perforating, hemming, gluing, melt bonding (welding), particularly by means of ultrasound welding, stapling and so on.

For a simple application of the LED band and for a simple application of the covering onto the basis, the width of the basis is equal to or greater than the width of the LED band. In the case of a protruding basis the covering is preferably at least attached to the protruding part; apart from that the covering is attached by winding it in an encompassing manner around the lateral edge and the lower side of the basis The application is preferably achieved by means of adhesive bonding of the LED band onto the basis, specifically by means of adhesive bonding of a particularly self-adhesive lower side of the substrate of the LED band onto the basis. Alternatively, a fixing of the LED band with the protective sheath may also be achieved without adhesive bonding of the LED band, for example by means of the connection between the covering and the basis of the protective sheath, for example by means of lateral clamping.

In order to cover end areas, particularly after a separation of the LED band with the protective sheath, it is preferred if a terminal area of the protective sheath is finished by means of an end cap. For example, the end cap is formed as a casing comprising an inner cross sectional outline in the direction of attachment, which corresponds to the outer cross sectional outline of the protective sheath or which is marginally tighter.

For an effective protection of the light emitting diodes of the LED band a protective sheath is preferred, where the covering provides a bulge for each of the light emitting diodes of the LED band, for example similar to a so called blister package. By means of the bulge an individual cavity is created for each LED position, while the covering may be brought close to the remaining area of the upper side of the LED band. This way, in a damaged protective sheath a propagation of dirt or humidity across a larger area of the LED band is hindered or even prevented.

The covering may at least partially be light-transmissive, this is to mean transparent or translucent, for example completely light-transmissive. In a preferred arrangement, the covering is light-transmissive in a near field of a LED and otherwise non light-transmissive. Thereby, a higher quality look-and-feel may be achieved, wherein from the outside substantially only the LEDs are visible and the conductor tracks or further components are invisible.

It is particularly preferred a covering comprising bulges for a LED, in which the bulge is light-transmissive, particularly transparent, and where the covering otherwise is non light-transmissive.

In one arrangement the covering preferably comprises at least one optical element to guide the beam of the light emitted from the LED band in order to improve the optical light emitting characteristics. This optical element is preferably located above a position designated for a LED or LEDs, respectively, particularly at the tip of a bulge for a light source.

Preferably the covering comprises a plastic sheet.

For the attachment of the lighting apparatus and the protective sheath, respectively, it is preferred if the basis comprises at least one self-adhesive area at an outer side of the protective sheath. Preferably, the outer side of the basis averted to the LED band is self-adhesive; for example, a double sided adhesive tape is attached thereto.

The lighting apparatus comprises at least one such protective sheath and at least on LED band accommodated therein.

In order to achieve good heat dissipation from the LED band, the LED band bears on the basis in a laminar manner.

For a simple and automated application the LED band is glued onto the basis.

Preferably, the lighting apparatus further is separable, particularly may be cut to be separated.

The method for producing a lighting apparatus comprising a LED band and a protective sheath for a LED band comprising a basis for attaching the LED band and an at least partially light-transmissive covering connectable thereto, wherein during attachment of the basis to the covering an accommodating space is formed for the LED band, the method comprising at least the following steps: Application of the LED band onto the basis and affixing the basis on the covering.

In the case of the above described solution a populated flexible substrate (flexible LED band) is preferably glued onto an aluminum base foil and is consequently connected to a comparably stiff packaging foil. The ability to cut is maintained. As a sealing an end cap is preferably used which is pushed over the end of the product.

The advantage of the above solution is first and foremost the protection against mechanical damage and the protection against dust and/or humidity. Different materials (type of material, lucent, matte and so on) and shapes (the shapes may selectively be used to adjust rigidity/flexibility) may be used. For sealing with respect to increased specifications a step of shrinking comprising local heating of the end cap may preferably be provided; alternatively, the connection interface may be provided with a sealant or an adhesive.

A further advantage is the feasibility of modular separation. Certain combinations of material allow for cutting by the user, which is similar to that for a present day unprotected product. Particularly in combination with an end cap enclosing the cut end in a sealing manner the protective function is reestablished.

Figure 1B:
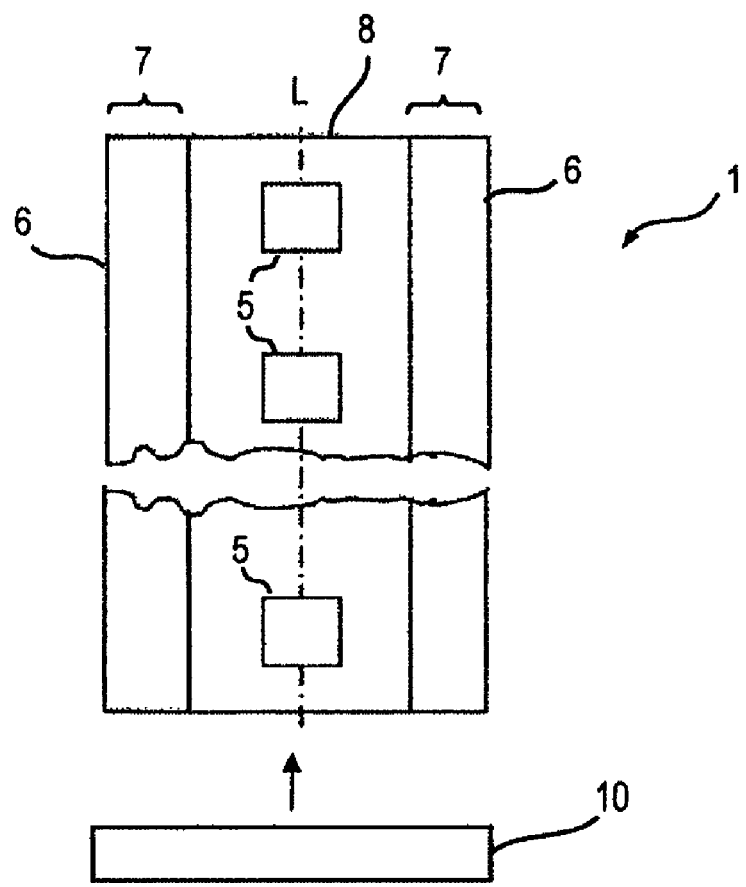

FIG. 1A shows in a cross-sectional view a lighting apparatus 1 comprising a LED band 2, which is accommodated in a protective sheath 3 according to a first embodiment. FIG. 1B shows the lighting apparatus 1 of FIG. 1A in top view.

LED band 2 comprises a flexible substrate 4 with a white conversion LED 5 exemplarily mounted on the upper side thereof. Not shown but also mounted on the surface are electronic components, such as resistors and current drivers. The lower side of substrate 4 comprises a double sided adhesive tape (not shown). LED band 2 may for example be carried out as a LED band of the flexible LINEARlight series from the company OSRAM.

In order to manufacture the lighting apparatus 1 the flexible LED band 2 comprising the self-adhesive lower side of substrate 4 is applied to a band-shaped basis 6 in the form of a thin aluminum foil of pure aluminum or an aluminum composite material and adheres thereto. Since the width of basis 6 is greater than that of substrate 4 a laterally protruding area 7 results. A transparent plastic covering 8 is applied to the upper side of the laterally protruding area 7, to which also the LED band 2 adheres, and is attached to basis 6, for example by means of ultrasound welding. In doing so, a tunnel- shaped protected accommodation space 9 for the LED band 2 results. In order to mount the lighting apparatus I the lower side of the protective sheath 3 may be carried out self- adhesive, for example by means of affixing a self-adhesive tape (not shown).

The basis 6 of the protective sheath 3 is such thin and thereby such ductile (having low rigidity), that it does not significantly influence the flexibility of the LED band 2. A rigidity of the protective sheath 3, also necessary to maintain the shape, is rather achieved by means of the plastic covering 8 which is more rigid than the basis 6. Thereby it is also avoided that the covering 8 is positioned too close to the LEDs 5 or actually touches these.

Alternatively, particularly in order to assure a distance between the covering and the LED band 2, the basis may be formed more rigid, wherein the covering 8 then in turn may be formed more flexible.

In order to complete the two terminal areas of the lighting apparatus 1 a cap-shaped end cap 10 may be attached as is indicated by the arrow pointing towards the longitudinal direction L of lighting apparatus 1. The inner cross-sectional contour of end cap 10 in the direction of attachment substantially corresponds to the outer cross-sectional contour of lighting apparatus 1 in the case of a simple cap, but may be formed somewhat tighter to achieve a firm clamping fit.

The lighting apparatus 1 may be manufactured from or with the LED band 2 in a single process step, preferably using a reel to reel production process.

Figure 2A:
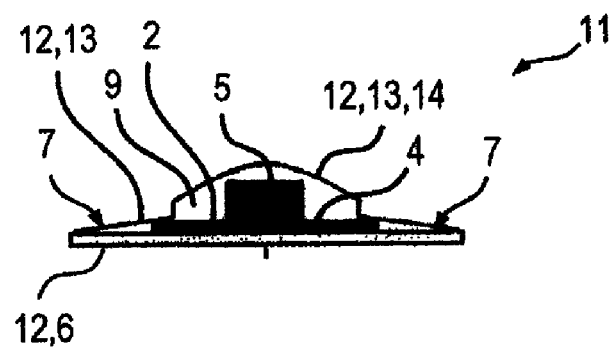
FIG. 2 shows a lighting apparatus comprising a LED band with a protective sheath according to a second embodiment in a cross-sectional view (FIG. 2A) and in a top view (FIG. 2B)
Figure 2B:
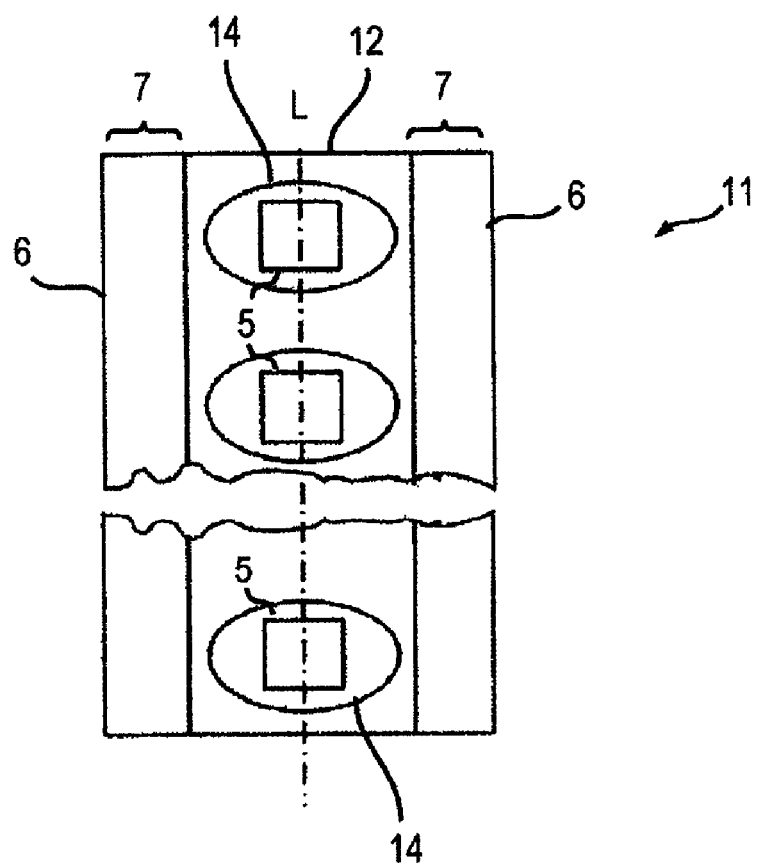

In a cross-sectional view FIG. 2A shows a lighting apparatus 11 according to a further embodiment comprising a LED band 2 such as shown in FIG. 1, which is accommodated in a protective sheath 12 comprising a covering 13 according to the further embodiment. FIG. 2B shows the lighting apparatus 11 of FIG. 2A in top view.

Contrary to the embodiment of FIG. 1, for each of the light emitting diodes 5 of the LED band 2 a bulge 14 similar to a blister package is now provided at the covering 13, while the remaining area of the covering 13 is formed closer to the LED band 2 and preferably at least partially bears thereon. The propagation of impurities and vapors in the protective sheath 12, if these should still one day permeate, for example as a result of a damage or leakage of the protective sheath 12, is inhibited or even eliminated by means of the bulges 14.

Furthermore, the protective sheath 12 according to this embodiment is light-transmissive at the bulge 14 and otherwise non light-transmissive, which results in a high quality look-and-feel. The protective sheath 12 may be attached to the basis 6 in the same manner as described in FIG. 1.

Figure 3A:
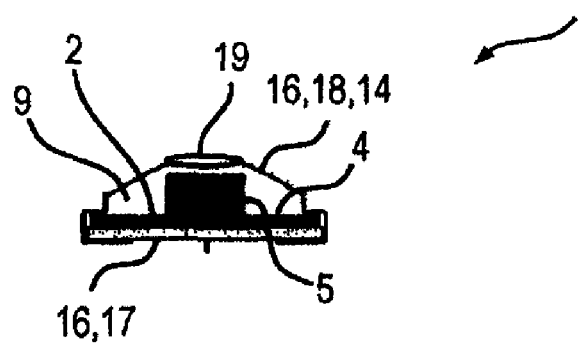
FIG. 3 shows a lighting apparatus comprising a LED band with a protective sheath according to a third embodiment in a cross-sectional view (FIG. 3A) and in a top view (FIG. 3B).
Figure 3B:
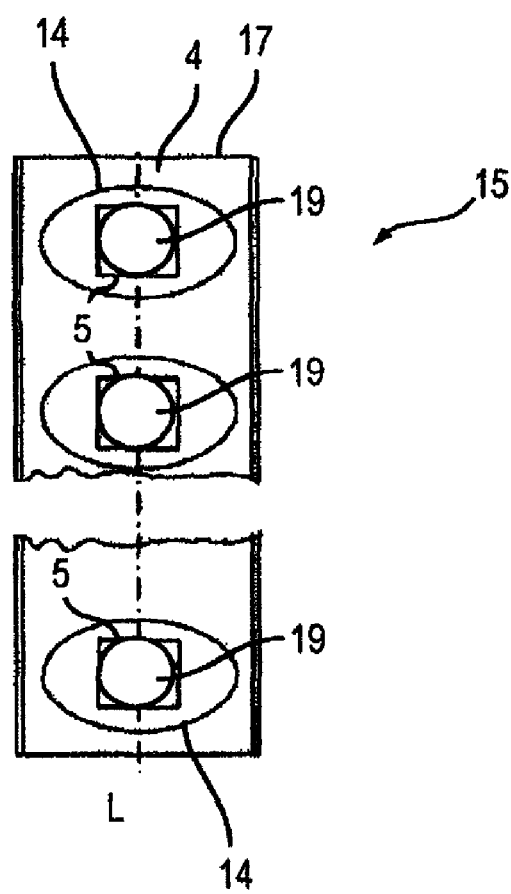

In a cross-sectional view FIG. 3A shows a lighting apparatus 15 according to yet a further embodiment similar to the embodiment of FIG, 2 comprising a protective sheath 16 according to the further embodiment. FIG. 3B shows the lighting apparatus 15 of FIG. 3A in top view. With this protective sheath 16 the basis 17 now has exactly the same width as the substrate 4 of LED band 2, so that no protruding area exists anymore. While the shape of the covering 18 above the LED band 2 substantially matches the shape of FIG. 2 and particularly comprises the bulges ("blister") 14, the edges of covering 18 are encompassingly bent around the substrate 4 and the basis 17. Covering 18 may further be fixedly attached to the basis 17, that is to say at its lower side averted to the LED band 2, for example by means of ultrasound welding, or may be snapped on, wherein the covering 18 is affixed to substrate 4 and basis 17, for example by a clamping action. Thereby, a more rigid linkage and a slimmer device along with a somewhat more complex production are achieved with the LED band 2, The lighting apparatus 16 may alternatively also get along without an adhesive bond between the substrate 4 and the basis 17. A fixing of the protective sheath 16 to the substrate 4 then for example occurs by means of the lateral clamping. Alternatively, the substrate 4 may also be attached to the basis 17 by means of micro-perforation or the like.

In a further difference as compared to the exemplary embodiment according to FIG. 2 a lens 19 for guiding the beam of the light emitted from LED band 2 and the corresponding LEDs 5, respectively, is integrated into the upper part of bulge 14.

It is to be understood that the present invention is not limited to the exemplary embodiments shown.

As such, the basis may also be comparatively rigid, for example as a result of a greater thickness.

The optical elements also may comprise other elements than lenses, such as collimators. The lenses may have a different shape, for example oval, as well as a different size.

The lighting apparatus, instead of white conversion LEDs, may for example also comprise LED modules comprising several chips with single LEDs ("LED cluster"), which together may result in a white light mixture, for example "cold white" or "warm white". In order to produce a white light mixture the LED cluster preferably comprises light emitting diodes which illuminate using the base colors red (R), green (G) and blue (B). In doing so, one or more colors may also be produced by several LEDs simultaneously; as such combinations RGB, RRGB, RGGB, RGBB, RGGBB and so on are feasible. However, the color combination is not limited to R, G and B (and A). For example, in order to create a warm white color also one or several amber colored LEDs (A) may be provided. Using LEDs having different colors, these may preferably be driven such that the LED module selectively illuminates comprising a variable RGB color scale.

Generally, aside from or instead of a LED any other semiconductor emitter may be used as well.

REFERENCE NUMBERS 1 lighting apparatus
2 LED band
3 protective sheath
4 flexible substrate
5 LED
6 basis
7 protruding area
8 transparent plastic covering
9 accommodation space
10 end cap
11 lighting apparatus
12 protective sheath
13 covering
14 bulge
15 lighting apparatus
16 protective sheath
17 basis
18 covering
19 lens

What is claimed is:

1. A protective sheath for an LED band comprising:
a basis for attaching the LED band and an at least partially light-transmissive covering attachable thereto,
wherein the LED band comprises a band-shaped substrate comprising plurality of light emitting diodes directly attached to an upper side of the substrate,
wherein the substrate of the LED band is attached to the basis of the of the protective sheath,
wherein the basis and the covering in the attached state form an accommodation space for the LED band,
wherein the covering comprises a plastic sheet, and
wherein a space exists between the covering and the light emitting diodes of the LED band.

2. The protective sheath of claim 1,
wherein the basis is flexible.

3. The protective sheath of claim 2,
wherein the basis comprises an aluminum foil having a thickness between 0.010 mm and 0.015 mm.

4. The protective sheath of claim 1,
wherein the basis is band-shaped and the covering is only attached to the basis along a lateral area of the basis.

5. The protective sheath of claim 4,
wherein the width of the basis is greater than the width of the LED band and the covering is attached to the basis at a protruding part of the basis.

6. The protective sheath of claim 1,
wherein a terminal area of the protective sheath can be finalized by means of an end cap.

7. The protective sheath of claim 1,
wherein the covering provides a bulge for each of the light emitting diodes of the LED band.

8. The protective sheath of claim 1,
wherein the covering is light-transmissive in an area close to a LED and is non light-transmissive otherwise.

9. The protective sheath of claim 7,
wherein the covering is light-transmissive at the bulge and is non light-transmissive otherwise.

10. The protective sheath of claim 1,
wherein the covering comprises at least one optical element for guiding the beam of the light emitted by the LED band.

11. A lighting apparatus, comprising at least one LED band accommodated therein and at least one protective sheath for the LED band comprising:
a basis for attaching the LED band and an at least partially light-transmissive covering attachable thereto,
wherein the LED a band comprises a band-shaped substrate comprising a plurality of light emitting diodes directly attached to an upper side of the substrate,
wherein the substrate of the LED band is attached to the basis of the of the protective sheath,
wherein the basis and the covering in the attached state form an accommodation space for the LED band,
wherein the covering comprises a plastic sheet, and
wherein a space exists between the covering and the light emitting diodes of the LED band.

12. The lighting apparatus of claim 11,
wherein the basis is band-shaped and the covering is only attached to the basis along a lateral area of the basis, 13. The lighting apparatus of claim 11,
wherein the LED band bears on the basis in a laminar manner or is glued thereto.

14. The lighting apparatus of claim 11,
which is separable or separable by cutting.

15. A method for manufacturing a lighting apparatus comprising a LED band and comprising a protective sheath for the LED band comprising a basis for attaching the LED band and an at least partially light-transmissive covering attachable thereto, wherein during attaching the basis to the covering an accommodation space is formed for the LED band,
wherein the LED band comprises a band-shaped substrate comprising a plurality of light emitting diodes directly attached to an upper side of the substrate,
wherein the substrate of the LED band is attached to the basis of the of the protective sheath,
wherein the method comprises at least the following steps:
applying the LED band to the basis;
affixing the basis to the covering,
wherein the covering comprises a plastic sheet, and
wherein a space exists between the covering and the light emitting diodes of the LED band.

16. The protective sheath of claim 4,
wherein the covering is attached to the basis by winding it in an encompassing manner around the lateral edge and the lower side of the basis.

17. The protective sheath of claim 2,
wherein the covering is more rigid than the basis.

18. The lighting apparatus of claim 11,
wherein the covering is more rigid than the base.

19. The lighting apparatus of claim 11,
wherein the basis comprises an aluminum foil having a thickness between 0.010 mm and 0.015 mm.

20. The lighting apparatus of claim 12,
wherein the width of the basis is greater than the width of the LED band and the covering is attached to the basis at a protruding part of the basis.

21. The light apparatus of claim 11,
wherein the LED band is adhesively bonded on the basis.

22. The light apparatus of claim 21,
wherein a particularly self-adhesive lower side of the substrate of the LED band is adhesively bonded onto the basis.

* * * * *